United States Patent
Tanaka et al.

(10) Patent No.: US 7,312,635 B2
(45) Date of Patent: Dec. 25, 2007

(54) INTEGRATED CIRCUIT PROVIDED WITH CORE UNIT AND INPUT AND OUTPUT UNIT

(75) Inventors: Yoshihisa Tanaka, Kyoto (JP); Shigehide Yano, Kyoto (JP)

(73) Assignee: Rohm Co., Ltd. (JP)

( * ) Notice: Subject to any disclaimer, the term of this patent is extended or adjusted under 35 U.S.C. 154(b) by 84 days.

(21) Appl. No.: 11/255,720

(22) Filed: Oct. 21, 2005

(65) Prior Publication Data

US 2006/0091906 A1    May 4, 2006

(30) Foreign Application Priority Data

Oct. 22, 2004  (JP) ............................. 2004-307717
Aug. 25, 2005  (JP) ............................. 2005-244780

(51) Int. Cl.
*H03K 19/0175* (2006.01)

(52) U.S. Cl. ........................... 326/80; 326/81; 326/62; 326/63

(58) Field of Classification Search .................. 326/33, 326/56–58, 62–63, 68, 80–83; 327/333
See application file for complete search history.

(56) References Cited

U.S. PATENT DOCUMENTS 5,883,528 A * 3/1999 Kashmiri et al. ............. 326/71
6,339,344 B1 * 1/2002 Sakata et al. ................. 326/83

FOREIGN PATENT DOCUMENTS

JP        2001-184330        7/2001

* cited by examiner

*Primary Examiner*—Anh Q. Tran
(74) *Attorney, Agent, or Firm*—Cantor Colburn LLP

(57) ABSTRACT

A core unit implements a predetermined function. An I/O unit controls input from and output to the outside. The core unit and the I/O unit are subject to independent control for supply of power. When power is turned off in the core unit, a signal output from the I/O unit to the core unit is fixed at a low level, while power is maintained in the I/O unit. A first level shifter and a second level shifter are provided between the core unit and the I/O unit and cancel a difference in power supply voltage level between the units. Power is turned off in the first level shifter and the second level shifter when power is turned off in the core unit.

20 Claims, 4 Drawing Sheets

INTEGRATED CIRCUIT PROVIDED WITH CORE UNIT AND INPUT AND OUTPUT UNIT

BACKGROUND OF THE INVENTION

1. Field of the Invention

The present invention relates to an integrated circuit provided with a core unit and an input and output unit, and to an electronic appliance in which such a circuit is mounted.

2. Description of the Related Art

Recently, as the process becomes increasingly finer, the circuit scale tends to be larger. This has also caused an increase in leak current. In applications with serious demand for reduction in power consumption, as represented by battery-driven portable equipment such as a cell phone, power consumption occurring in a standby state of an IC is of a non-negligible magnitude. This is particularly true of a sound LSI, which is in a standby state much of the time.

Patent document No. 1 discloses a microcontroller integrated circuit that addresses the requirement for low power consumption by comprising a low-power standby function, while maintaining the integrity of input and output ports. The circuit includes a microcontroller core logic (hereinafter, simply referred to as a core logic), an input and output port logic adapted to store an output logic level, an interface logic connected between the core logic and the input and output port logic, and a power switch controlled by the input and output port logic.

[Patent document No. 1]
 JP 2001-184330 A

In the circuit disclosed in patent document No. 1, the physical reliability at a node between the core logic and the input and output port logic may be impaired when power is turned off in the core logic. Further, there is a possibility that a leak current occurs.

SUMMARY OF THE INVENTION

The present invention has been made in view of the aforementioned circumstances and provides an integrated circuit and an electronic appliance in which the circuit is mounted, capable of reducing power consumption, while maintaining circuit reliability.

In order to solve the aforementioned problem, the integrated circuit according to an embodiment of the present invention comprises a first block and a second block subject to independent control for supply of power. The second block fixes a signal output to the first block at a predetermined potential when power is turned off in the first block. To turn power off, the power supply voltage of the first block may be lowered to the ground level or the power supply voltage may be lowered to a level lower than that of a normal operation. For example, the ground may be floating at several mV due to a component such as parasitic capacitance. The predetermined potential may be of a low level or a high level.

According to this embodiment, by fixing the signal output from the second block to the first block at, for example, a low level when power is turned off in the first block, latchup at a node between the first block and the second block is prevented. Thus, power consumption is suppressed while circuit reliability is maintained.

A level shifter which cancels a difference in power supply voltage level between the first block and the second block may be provided between the first block and the second block. Power may be turned off in the level shifter when power is turned off in the first block. According to this embodiment, in a circuit in which power supply voltages differ in level between the first block and the second block, power consumption in the level shifter is also reduced when power is turned off in the first block. Also, a leak current due to the level shifter is suppressed.

The integrated circuit according to another embodiment of the present invention comprises a core unit which implements a predetermined function and an input and output unit which controls input and output from and to the outside. The core unit and the input and output unit are subject to independent control for supply of power. The input and output unit fixes a signal output to the core unit at a predetermined potential when power is turned off in the core unit. The predetermined function may be one or both of computation and data storage. To turn power off, the power supply voltage of the core unit may be lowered to the ground level or the power supply voltage may be lowered to a level lower than that of a normal operation. The predetermined potential may be of a low level or a high level. The input and output unit may include a logic gate which receives, a signal for turning power off in the core unit, an external signal and an enable signal from the core unit. The logic gate may output a signal for fixing the signal output to the core unit at a predetermined potential, when the signal for turning off power in the core unit goes active. For example, the logic gate may output a low level.

According to this embodiment, by fixing the signal output from the input and output unit to the core unit at, for example, a low level when power is turned off in the core unit, latchup at a node between the core unit and the input and output unit is prevented. Thus, power consumption is suppressed while circuit reliability is maintained.

A level shifter which cancels a difference in power supply voltage level between the first block and the second block may be provided between the first block and the second block. Power may be turned off in the level shifter when power is turned off in the core unit. According to this embodiment, in a circuit in which power supply voltages differ in level between the core unit and the input and output unit, power consumption in the level shifter is also reduced when power is turned off in the core unit. Also, a leak current due to the level shifter is suppressed.

The input and output unit may cut a path for signal transmission from the core unit to the outside when power is turned off in the core unit. The input and output unit may further comprise a tri-state buffer for cutting the path for signal transmission from the core unit to the outside. The tri-state buffer may cut the path for signal transmission when a signal for turning off power in the core unit goes active. The input and output unit may further comprise a switching element provided between the ground a signal transmission path connecting the tri-state buffer to the outside. The switching element may be turned on and lower a potential on the signal transmission path when the signal for turning off power in the core unit goes active. According to this embodiment, power consumption due to a current from the core unit is suppressed.

A plurality of input and output units may be laid out around the core unit, and a signal line may be provided in a space between the core unit and the input and output units to notify the input and output units that power is turned off in the core unit. A relay buffer for compensating for attenuation of a signal to be transmitted by the signal line maybe provided. According to this embodiment, the input and output units are notified of the fact that power is turned off in the core unit, using a short signal line.

A circuit for driving the signal line may be provided in a power supply system of the input and output unit. According to this embodiment, a signal for notifying the input and output units of the fact that power is turned off in the core unit can be sent when power is turned off in the core unit.

The integrated circuit according to still another embodiment of the present invention comprises the integrated circuit according to any of the embodiments above and a power supply circuit which supplies power to the integrated circuit. According to this embodiment, it is possible to realize an electronic appliance in which power consumption is suppressed while circuit reliability is maintained.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on the preferred embodiments. This does not intend to limit the scope of the present invention, but exemplify the invention.

First Embodiment

Figure 1:
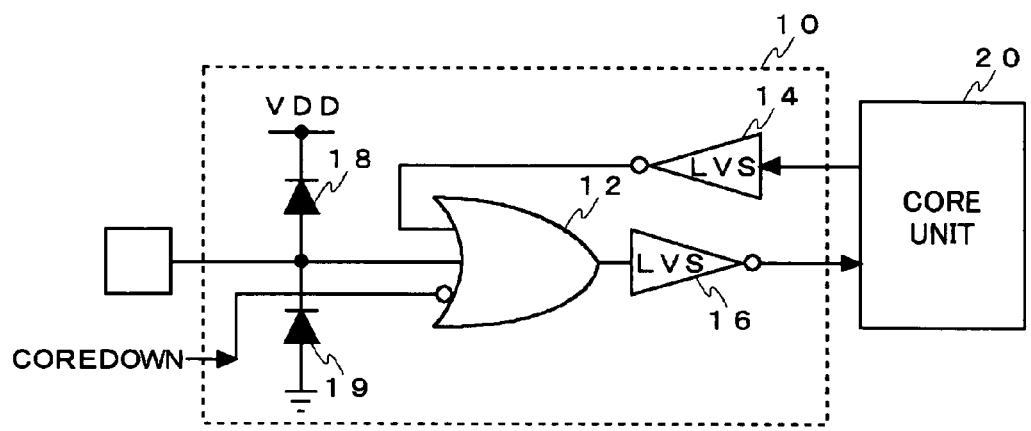
FIG. 1 is a circuit diagram showing the structure of an integrated circuit according to a first embodiment that includes an I/O unit and a core unit.

FIG. 1 is a circuit diagram showing the structure of an integrated circuit 50 according to a first embodiment that includes an I/O unit 10 and a core unit 20. The first embodiment provides a structure whereby the reliability of the circuit is not impaired even when power supply to the core unit 20 is suspended.

The I/O unit 10 is peripheral to the core unit 20 and functions as an interface between the core unit 20 and the outside. The I/O unit 10 is provided with a first OR circuit 12. The first OR circuit 12 is provided with three input terminals. An output signal from a first level shifter 14, an input signal from an external source and a core down signal COREDOWN are input to the respective input terminals. An output of the first OR circuit 12 is output to the core circuit 20 via a second level shifter 16. A first diode 18 and a second diode 19 provided between a power supply voltage VDD line and the ground are for electrostatic protection. When a voltage that exceeds a break down level of the first diode 18 and the second diode 19 is applied to at least one of the power supply voltage line and a signal line, the first diode 18 and the second diode 19 conduct a reverse current so as to pull the current out of the circuit to the ground.

The first level shifter 14 and the second level shifter 16 make adjustment to address a difference in level between a power supply voltage in the I/O unit 10 and a power supply voltage in the core unit 20. For example, assuming that the power supply voltage in the I/O unit 10 is 3.0V and the power supply voltage in the core unit 20 is 1.8V, the respective power supply voltages are properly supplied to the I/O unit 10 and the core unit 20, by providing the level shifters between the I/O unit 10 and the core unit 20. The first level shifter 14 and the second level shifter 16 are of a type that inverts an input high-level signal or low-level signal for output.

An input enable signal is input from the core unit 20 to the first level shifter 14. The first level shifter 14 inverts the input enable signal and outputs a resultant low-level signal or high-level signal to the first OR circuit 12.

The core down signal COREDOWN is set by a user. When the supply of power to the core unit 20 is suspended, the core down signal is set low. Since the core down signal COREDOWN is inverted before being input to the first OR circuit 12, a high level is input to the first OR circuit 12. Since the first OR circuit 12 is a logic gate that outputs a high level when a high level is input to at least one of its input terminals, the first OR circuit 12 outputs a high level to the second level shifter 16. The second level shifter 16 inverts an output signal of the first OR circuit 12 and outputs a low level to the core unit 20.

Concurrently with the suspension of supply of power to the core unit 20, the supply of power to the first level shifter 14 and the second level shifter 16 of the I/O unit 10 is also suspended. With this, the level shifting function of the first level shifter 14 and the second level shifter 16 is suspended.

Thus, once the core down signal COREDOWN is set low, a low level can be output to the core unit 20 regardless of the logic of the external input signal and the input enable signal from the core unit 20. Even when the core unit 20 is in a standby state, leaving the input enable signal in a high impedance state (floating state), a low level continues to be output to the core unit 20.

As described above, according to the first embodiment, the reliability of the circuit is maintained when the supply of power to the core unit 20 is suspended, by fixing low the signal from the I/O unit to the core unit 20. That is, situations such as latchup and degradation in durability of elements are prevented from occurring even when a voltage is applied by an input signal from an external circuit. Also, a leak current at an interface between the I/O unit 10 and the core unit 20 is suppressed. Since the supply of power to the level shifters 14 and 16 provided between the I/O unit 10 and the core unit 20 is suspended, power consumption in the level shifters 14 and 16 is suppressed and a leak current due to the level shifters 14 and 16 is also suppressed.

Second Embodiment

Figure 2:
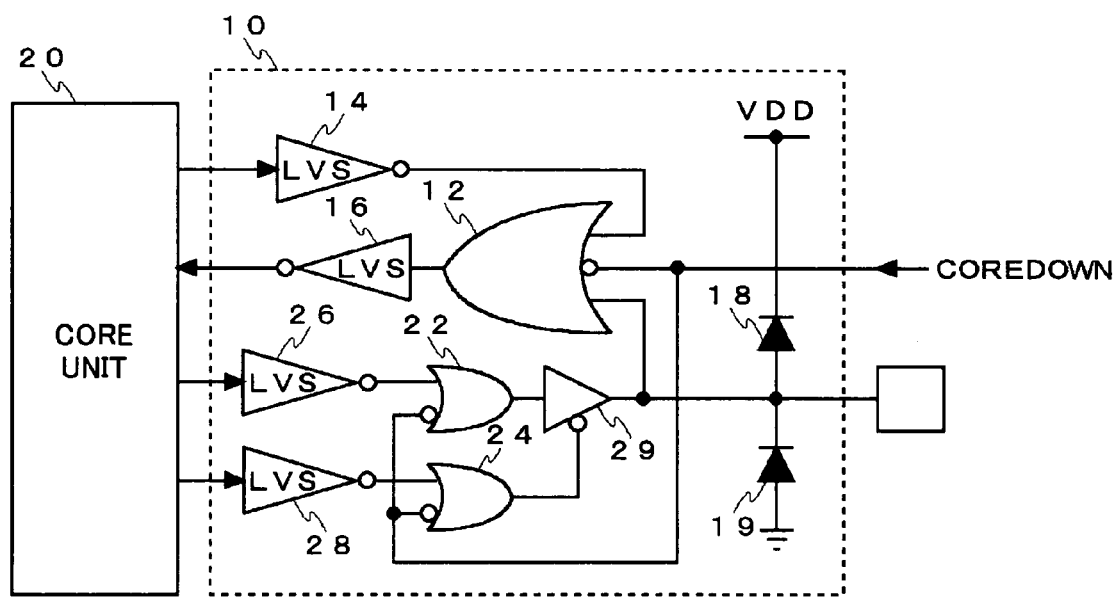
FIG. 2 is a circuit diagram showing the structure of an integrated circuit according to a second embodiment that includes an I/O unit and a core unit.

In the first embodiment, the structure for input is presented. In the second embodiment, a bidirectional structure is presented. FIG. 2 is a circuit diagram showing the structure of an integrated circuit 50 according to the second embodiment that includes an I/O unit 10 and a core unit 20. The structure and operation of the first OR circuit 12, the first level shifter 14 and the second level shifter 16 are the same as those of the first embodiment. Similarly to the first embodiment, the first diode 18 and the second diode 19 form a protective circuit, similarly to the first embodiment.

A signal to be output from the core unit 20 is input to a third level shifter 26. The third level shifter 26 inverts the signal to be output and inputs an inverted version to a second OR circuit 22. The second OR circuit 22 receives a signal from the third level shifter 26 and an inverted version of the core down signal COREDOWN. A fourth level shifter 28 receives an output enable signal from the core unit 20. The fourth level shifter 28 inverts the output enable signal and inputs an inverted version to a third OR circuit 24. The third OR circuit 24 receives a signal from the fourth level shifter 28 and the inverted version of the core down signal COREDOWN. Normally, the output enable signal is an inverted version of the input enable signal.

An output signal of the second OR circuit 22 is applied to an input terminal of a tri-state buffer 29. An output signal of the third OR circuit 24 is logically inverted and applied to a control terminal of the tri-state buffer 29. The tri-state buffer 29 is a buffer placed in a high-impedance state according to the level of a control signal. When a low level is applied to the control terminal, the tri-state buffer is placed in a high impedance state, in which the input and output of the tri-state buffer 29 are disconnected from each other. In this state, the signal from the core unit 20 is prevented from being output. That is, the tri-state buffer 29 switchably controls whether data input and output between the core unit 20 and the outside occurs.

Similarly to the first embodiment, the core down signal COREDOWN is brought low to suspend the supply of power to the core unit 20. This causes the inverted version of the core down signal COREDOWN to be applied to the input terminal of the second OR circuit 22. The output of the second OR circuit 22 remains high even when the output of the core unit 20 is left in a high impedance state (floating state) as a result of the suspension of power supply.

An inverted version (a high level) of the core down signal COREDOWN is applied to the input terminal of the third OR circuit 24. With this, the output of the third OR circuit 24 remains high regardless of the output enable signal. Thus, an inverted version (a low level) of the output of the third OR circuit 24 is applied to the control terminal of the tri-state buffer 29 so that an output line from the core unit 20 is disconnected from the outside. The input signal from the I/O unit 10 to the core unit 20 is maintained low, similarly to the first embodiment.

As described above, an added advantage of the second embodiment over the first embodiment is that power consumption is suppressed by disconnecting the output line, even when the output terminal of the core unit 20 is left in a high-impedance state as a result of the suspension of power supply to the core unit 20.

Third Embodiment

Figure 3:
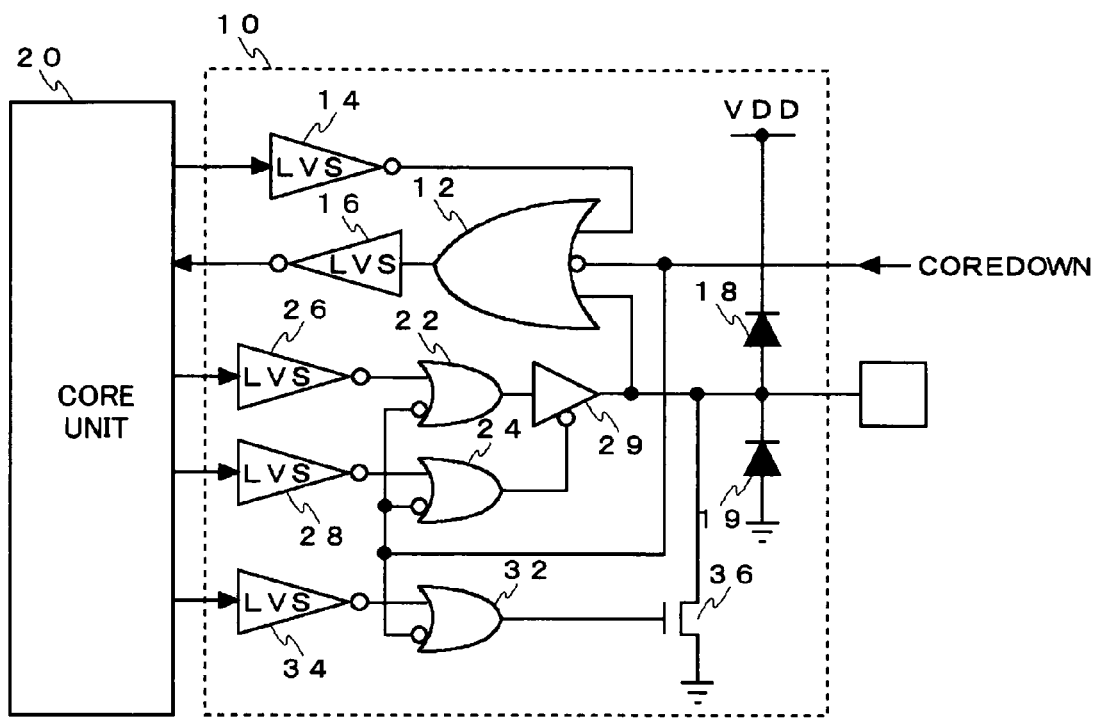
FIG. 3 is a circuit diagram showing the structure of an integrated circuit according to a third embodiment that includes an I/O unit and a core unit.

The third embodiment provides a structure in which a pull-down function is added to the structure of the second embodiment. FIG. 3 is a circuit diagram showing the structure of an integrated circuit 50 according to the third embodiment that includes an I/O unit 10 and a core unit 20. The structure and operation of those components other than a fourth OR circuit 32, a fifth level shifter 34 and a transistor 36 are the same as those of the second embodiment.

An output enable signal is input from the core unit 20 to the fifth level shifter 34. The fifth level shifter 34 inverts the output enable signal and inputs an inverted version to the fourth OR circuit 32. The fourth OR circuit 43 receives a signal from the fifth level shifter 34 and the inverted version of the core down signal COREDOWN. An output signal of the fourth OR circuit 32 is input to the gate of the transistor 36.

The transistor 36 is a field effect transistor which conducts when a high level is input to its gate. The drain of the transistor 36 is connected to an input and output line connected to the outside and the source thereof is connected to the ground. A switching element other than a transistor may be used in place of the transistor 36.

Similarly to the first embodiment and the second embodiment, the core down signal COREDOWN is brought low to suspend the supply of power to the core unit 20. This causes an inverted version (a high level) of the core down signal COREDOWN to be applied to the input terminal of the fourth OR circuit 32. With this, the output of the fourth OR circuit 32 is set high regardless of the output enable signal.

Similarly to the second embodiment, the tri-state buffer 29 is left in a high impedance state when a low level obtained by inverting the output signal of the third OR circuit 24 is applied to the control terminal, thereby disconnecting the input and output of the tri-state buffer 29 from each other. In the third embodiment, the transistor 36 conducts concurrently with the disconnection so as to drop the level of the input and output line connected to the outside to the ground potential.

As described, an added advantage of the third embodiment over the second embodiment is that the input and output line connected to the outside is prevented from being in a high-impedance state, by additionally providing a pull-down mechanism. With this, malfunction is avoided.

Figure 4:
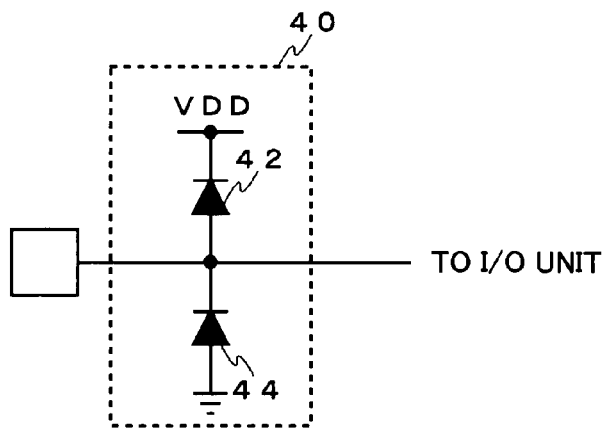
FIG. 4 shows the structure of a core down drive unit.

FIG. 4 shows the structure of a core down drive unit 40. A third diode 42 and a fourth diode 44 are provided between the power supply voltage VDD line and the ground in the core down drive unit 40 for electrostatic protection. When a voltage that exceeds a break down level of the third diode 42 and the fourth diode 44 is applied to at least one of the power supply voltage line and a signal line, the third diode 42 and the fourth diode 44 conduct a reverse current so as to pull the current out of the circuit to the ground.

Fourth Embodiment

Figure 5:
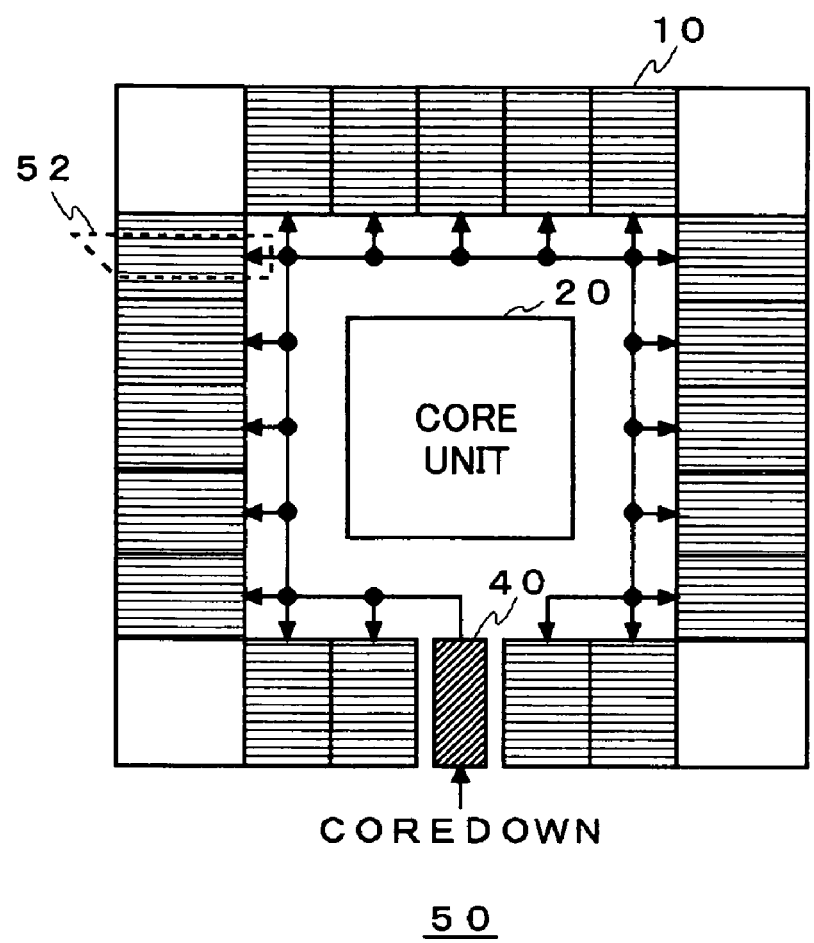
FIG. 5 shows an exemplary layout of an integrated circuit according to a fourth embodiment.

FIG. 5 shows an exemplary layout of the integrated circuit 50 according to a fourth embodiment. The integrated, circuit 50 uses the I/O unit 10 described in any of the first through third embodiments. A plurality of I/O units 10 are laid out to surround the core unit 20. Each I/O unit constitutes an I/O cell. FIG. 5 shows a total of nineteen cells, including five that are adjacent to the top, left and right of the core unit 20 and four that are adjacent to the bottom thereof. Each I/O unit 10 may be implemented by the unit according to any of the first through third embodiments. The core down drive unit 40 between selected ones of the I/O units 10, which are provided around the core unit 20 in a circular or rectangular formation. This results in the core unit 20 being surrounded by the I/O units 10 in a C-shaped formation and the core down drive unit 40 being laid out in a space in the C-shaped formation of the I/O units 10.

There is provided a space between the core unit 20 and the I/O units 10 surrounding the core unit 20, and between the core unit 20 and the core down drive unit 40. A core down signal line for delivering the aforementioned core down signal COREDOWN is provided. The core down signal line is not provided in an area of the core unit 20. The core down signal line is controlled by the power supply voltage of the I/O unit 10. For example, the core down signal line is driven by 3V. Since power supply to the core unit 20 is suspended in a standby mode, the power supply voltage of the I/O unit 10 is used. The core down drive unit 40 uses the signal line to supply the core down signal COREDOWN to the I/O units 10. According to this layout, the core down signal COREDOWN can be supplied to all of the I/O 10 units using a short signal line.

A relay buffer 52 may be provided to compensate for attenuation of the core down signal line provided in the aforementioned space. As the number of I/O units 10 to which the core down signal COREDOWN should be delivered is increased, attenuation of the core down signal COREDOWN becomes serious and it becomes difficult to supply equal level signals to the I/O units 10. In such a case, provision of the relay buffer 52 is highly required. The location of the relay buffer 52 and the number of the relay buffers 52 may differ depending on conditions that include those determined by the integrated circuit 50. For example, the level of attenuation of the core down signal COREDOWN differs depending on the number of I/O units 10 and on the thickness and length of the core down signal line. Optimum layout in each integrated circuit may be determined by simulation or experiments.

In FIG. 5, the relay buffer 52 is laid out at the second turn that the core down signal line makes. The relay buffer 52 applies a predetermined voltage so as to compensate for attenuation of voltage level incurred in a path leading from the core down drive unit 40 up to the corner. With this, adjustment is made so that the core down signal COREDOWN of an equal level is supplied from the core down signal line to the I/O units.

Figure 6:
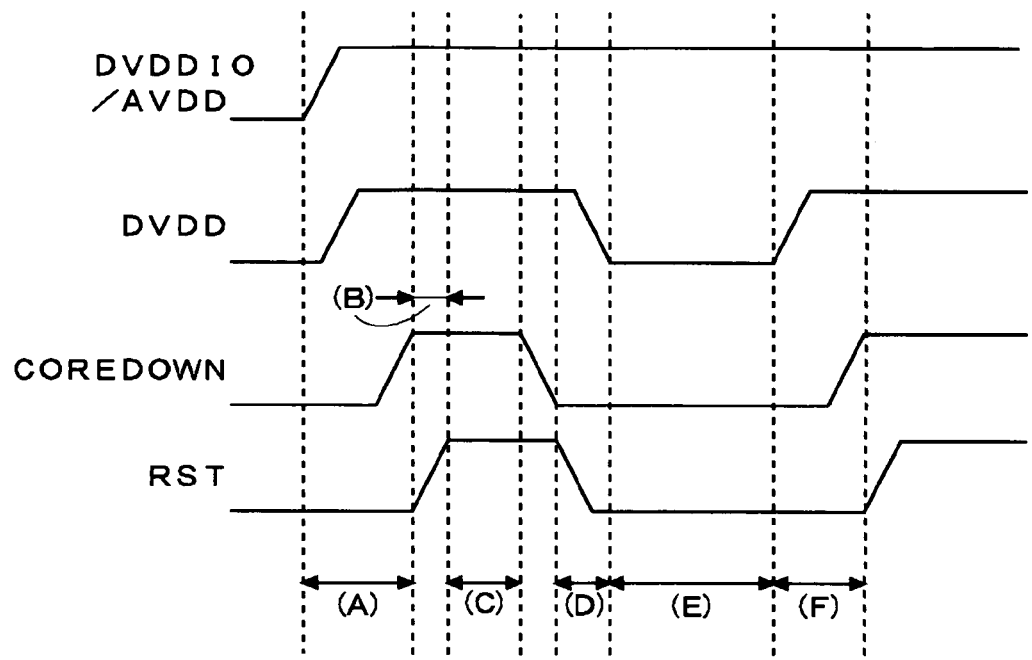
FIG. 6 is a timing chart showing a timing schedule observed by various signals used in the integrated circuit.

FIG. 6 is a timing chart showing a timing schedule observed by various signals used in the integrated circuit 50. In FIG. 6, period A is a period for turning power on. First, a digital power supply voltage DVDDIO of the I/O unit 10 and an analog power supply voltage AVDD of the core unit 20 rise and then a digital power supply voltage DVDD of the core unit 20 rises.

Subsequently, the core down signal COREDOWN is brought from low to high in order to activate the supply of power to the core unit 20. Period B is a period for reset cancellation. If the core down signal COREDOWN and a reset signal RST are timed to concur, circuit operation and physical reliability may be adversely affected. Therefore, the supply of power to the core unit 20 is suspended by the reset signal RST only when the I/O unit 10 is adapted to core down. The reset cancellation period is started when the I/O unit 10 is adapted to core down and ended when the supply of power to the core unit 20 is suspended. Period C is for normal operation. When all four signals mentioned above rise, the entirety of the integrated circuit 50 operates normally.

The core down signal COREDOWN is brought from high to low in order to suspend the supply of power to the core unit 20. Period D is a period for transition to low-power consumption operation. When the reset signal RST is brought to low, the supply of the digital power supply voltage DVDD to the core unit 20 is suspended. Period E is for low-power consumption operation. In period E, the supply of the digital power supply voltage DVDD to the core unit 20 is suspended, while the digital power supply voltage DVDDIO is properly supplied to the I/O unit 10. Period F is for cancellation of lower power consumption. The procedure for returning from standby mode (low power consumption operation) of the core unit 20 does not affect circuit operation or physical reliability and so the return may occur as desired.

As described, according to the fourth embodiment, it is possible to realize an integrated circuit 50 in which circuit reliability is not impaired even when the supply of power to the core unit 20 is suspended so that power consumption is suppressed accordingly.

Figure 7:
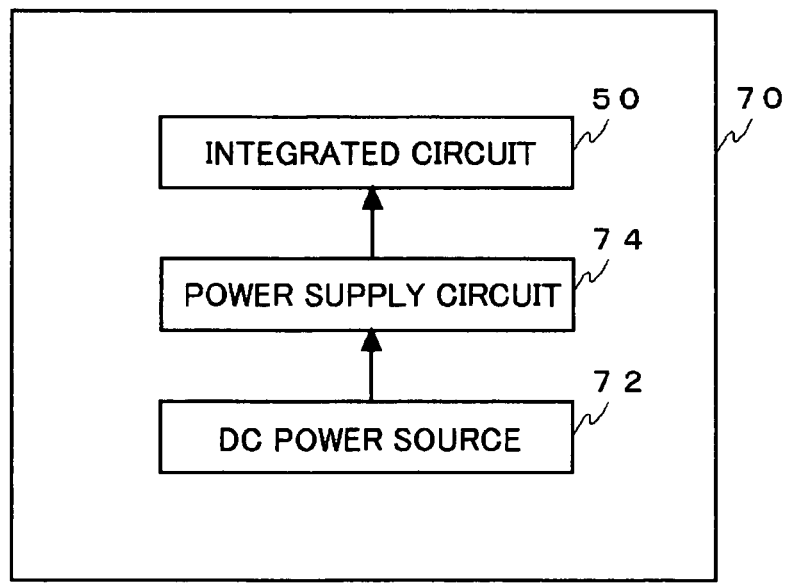
FIG. 7 is a block diagram showing the structure of an electronic appliance.

FIG. 7 is a block diagram showing the structure of an electronic appliance 70. Examples of the electronic appliance 70 primarily include electronic appliances of a portable type such as a cell phone, a personal handyphone system (PHS), a personal digital assistant (PDA), a digital camera and a music player. The electronic appliance 70 is provided with the integrated circuit 50 described in the fourth embodiment, a power supply circuit 74 for supplying power to the integrated circuit 50, a dc power source 72 for supplying power to the power supply circuit 74. Examples of the dc power source 72 include a lithium ion battery, a rechargeable battery and the like. The power supply circuit 74 supplies a power supply voltage to the integrated circuit 50 by boosting or stabilizing the power supply voltage from the dc power source 72. The integrated circuit 50 may be a sound LSI for producing sound based on predetermined audio data. In this case, the electronic appliance 70 is provided with a speaker.

By mounting the integrated circuit 50 according to any of the first through fourth embodiments on the electronic appliance 70, it is possible to realize an electronic appliance in which situations such as latchup and degradation in durability of components are prevented from occurring even when power consumption is suppressed. Accordingly, the purposes of extending the drive time of the electronic appliance and maintenance of the reliability of the circuit are both served.

Given above is a description based on the embodiments. The embodiments is only illustrative in nature and it will be obvious to those skilled in the art that variations in constituting elements and processes are possible within the scope of the present invention.

For example, in an approach contrary to the embodiments, the supply of power to the I/O unit 10 may be suspended and the supply of power to the core unit 20 may be maintained. In this case, there is provided a structure for fixing the signal from the core unit 20 low so that a current is prevented from being drawn from the core unit 20. Further, the supply of power to the level shifters at the interface between the core unit 20 and the I/O unit 10 is suspended. This structure may easily be applied to any of the circuits of FIGS. 1 through 3. With this approach, power consumption is suppressed while circuit reliability is maintained.

While the preferred embodiments of the present invention have been described using specific terms, such description is for illustrative purposes only, and it is to be understood that changes and variations may be made without departing from the spirit or scope of the appended claims.

What is claimed is:

1. An integrated circuit comprising:
   a first block and a second block subject to independent control for supply of power; and
   a level shifter between the first block and the second block, the level shifter canceling a difference in power supply voltage level between the first block and the second block, wherein
   the second block fixes a signal output to the first block at a predetermined potential when power is turned off in the first block, and power is turned off in the level shifter when power is turned off in the first block.

2. An integrated circuit comprising:
a first block and a second block subject to independent control for supply of power; and
a level shifter between the first block and the second block, the level shifter canceling a difference in power supply voltage level between the first block and the second block, wherein power is turned off in the level shifter when power is turned off in the first block.

3. An integrated circuit comprising:
a core unit which implements a predetermined function; and
an input and output unit which controls input and output from and to the outside, wherein
the core unit and the input and output unit are subject to independent control for supply of power, and
the input and output unit fixes a signal output to the core unit at a predetermined potential when power is turned off in the core unit, and the input and output unit includes a level shifter for canceling a difference in power supply voltage level between the input and output unit and the core unit, and power is turned off in the level shifter when power is turned off in the core unit.

4. An integrated circuit comprising:
a core unit which implements a predetermined function; and
an input and output unit which controls input and output from and to the outside, wherein
the core unit and the input and output unit are subject to independent control for supply of power, and
the input and output unit includes a level shifter for canceling a difference in power supply voltage level between the input and output unit and the core unit, and power is turned off in the level shifter when power is turned off in the core unit.

5. The integrated circuit according to claim 4, wherein the input and output unit cuts a path of signal transmission from the core unit to the outside when power is turned off in the core unit.

6. The integrated circuit according to claim 3, wherein the input and output unit includes a logic gate receiving a signal for turning off power in the core unit, an external signal and an enable signal from the core unit, and the logic gate outputs a signal for fixing the signal output to the core unit at a predetermined potential, when the signal for turning off power in the core unit goes active, and wherein
the input and output unit further includes a tri-state buffer for cutting a path for signal transmission from the core unit to the outside, and the tri-state buffer cuts the path when the signal for turning off power in the core unit goes active.

7. The integrated circuit according to claim 3, wherein the input and output unit further includes a logic gate receiving a signal for turning off power in the core unit, an external signal and an enable signal from the core unit, and wherein the input and output unit further includes a tri-state buffer for cutting a path for signal transmission from the core unit to the outside, and the tri-state buffer cuts the path when the signal for turning off power in the core unit goes active.

8. The integrated circuit according to claim 7, wherein the input and output unit further includes a switching element provided between the ground and a signal transmission path connecting the tri-state buffer to the outside, and wherein the switching element is turned on and lowers a potential on the signal transmission path when the signal for turning off power in the core unit goes active.

9. The integrated circuit according to claim 3, wherein a plurality of input and output units are laid out around the core unit, and a signal line is provided in a space between the core unit and the input and output units to notify the input and output units that power is turned off in the core unit.

10. The integrated circuit according to claim 4, wherein a plurality of input and output units are laid out around the core unit, and a signal line is provided in a space between the core unit and the input and output units to notify the input and output units that power is turned off in the core unit.

11. The integrated circuit according to claim 5, wherein a plurality of input and output units are laid out around the core unit, and a signal line is provided in a space between the core unit and the input and output units to notify the input and output units that power is turned off in the core unit.

12. The integrated circuit according to claim 6, wherein a plurality of input and output units are laid out around the core unit, and a signal line is provided in a space between the core unit and the input and output units to notify the input and output units that power is turned off in the core unit.

13. The integrated circuit according to claim 7, wherein a plurality of input and output units are laid out around the core unit, and a signal line is provided in a space between the core unit and the input and output units to notify the input and output units that power is turned off in the core unit.

14. The integrated circuit according to claim 8, wherein a plurality of input and output units are laid out around the core unit, and a signal line is provided in a space between the core unit and the input and output units to notify the input and output units that power is turned off in the core unit.

15. The integrated circuit according to claim 9, further comprising a circuit for driving the signal line, the circuit being provided in a power supply system of the input and output unit.

16. The integrated circuit according to claim 9, further comprising a relay buffer for compensating for attenuation of a signal to be transmitted by the signal line.

17. An electronic appliance comprising the integrated circuit according to claim 1 and a power supply circuit which supplies power to the integrated circuit.

18. An electronic appliance comprising the integrated circuit according to claim 3 and a power supply circuit which supplies power to the integrated circuit.

19. An electronic appliance comprising the integrated circuit according to claim 4 and a power supply circuit which supplies power to the integrated circuit.

20. An electronic appliance comprising the integrated circuit according to claim 9 and a power supply circuit which supplies power to the integrated circuit.

* * * * *